(12) United States Patent
Konagai et al.

(10) Patent No.: US 9,673,215 B1
(45) Date of Patent: Jun. 6, 2017

(54) SEMICONDUCTOR DEVICE AND METHOD FOR MANUFACTURING SEMICONDUCTOR DEVICE

(71) Applicant: Kabushiki Kaisha Toshiba, Minato-ku (JP)

(72) Inventors: Satoshi Konagai, Kasugai (JP); Shigeki Kobayashi, Kuwana (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/202,027

(22) Filed: Jul. 5, 2016

Related U.S. Application Data

(60) Provisional application No. 62/279,121, filed on Jan. 15, 2016.

(51) Int. Cl.
*H01L 27/11582* (2017.01)
*H01L 27/11556* (2017.01)
*H01L 21/285* (2006.01)
*H01L 21/768* (2006.01)
*H01L 23/532* (2006.01)

(52) U.S. Cl.
CPC .. *H01L 27/11582* (2013.01); *H01L 21/28556* (2013.01); *H01L 21/76879* (2013.01); *H01L 23/53295* (2013.01); *H01L 27/11556* (2013.01)

(58) Field of Classification Search
CPC ............. H01L 29/7869; H01L 29/4733; H01L 29/4908; H01L 21/02554; H01L 21/02488
See application file for complete search history.

(56) References Cited

U.S. PATENT DOCUMENTS

| | | | |
|---|---|---|---|
| 9,397,046 B1 * | 7/2016 | Sharangpani | ....... H01L 27/1157 |
| 9,406,694 B1 | 8/2016 | Ikeno et al. | |
| 9,443,861 B1 * | 9/2016 | Pachamuthu | ..... H01L 27/11524 |
| 2013/0155771 A1 | 6/2013 | Kim | |
| 2015/0003158 A1 | 1/2015 | Aritome | |
| 2015/0079746 A1 | 3/2015 | Kim | |
| 2016/0086964 A1 * | 3/2016 | Chien | ............... H01L 27/11556 257/314 |
| 2016/0126248 A1 * | 5/2016 | Rabkin | .................. H01L 29/408 257/321 |
| 2016/0276359 A1 * | 9/2016 | Oginoe | ............. H01L 27/11582 |
| 2016/0358933 A1 * | 12/2016 | Rabkin | ............. H01L 27/11582 |

* cited by examiner

*Primary Examiner* — Thao P Le
(74) *Attorney, Agent, or Firm* — Oblon, McClelland, Maier & Neustadt, L.L.P.

(57) ABSTRACT

According to one embodiment, the metal oxide films are provided between the metal layers and the insulating layers. The first metal nitride films are provided between the metal oxide films and the metal layers. The second metal nitride films are provided between the first metal nitride films and the metal layers. The intermediate films are provided between the first metal nitride films and the second metal nitride films. The intermediate films are of a different type of material from the metal oxide films.

20 Claims, 20 Drawing Sheets

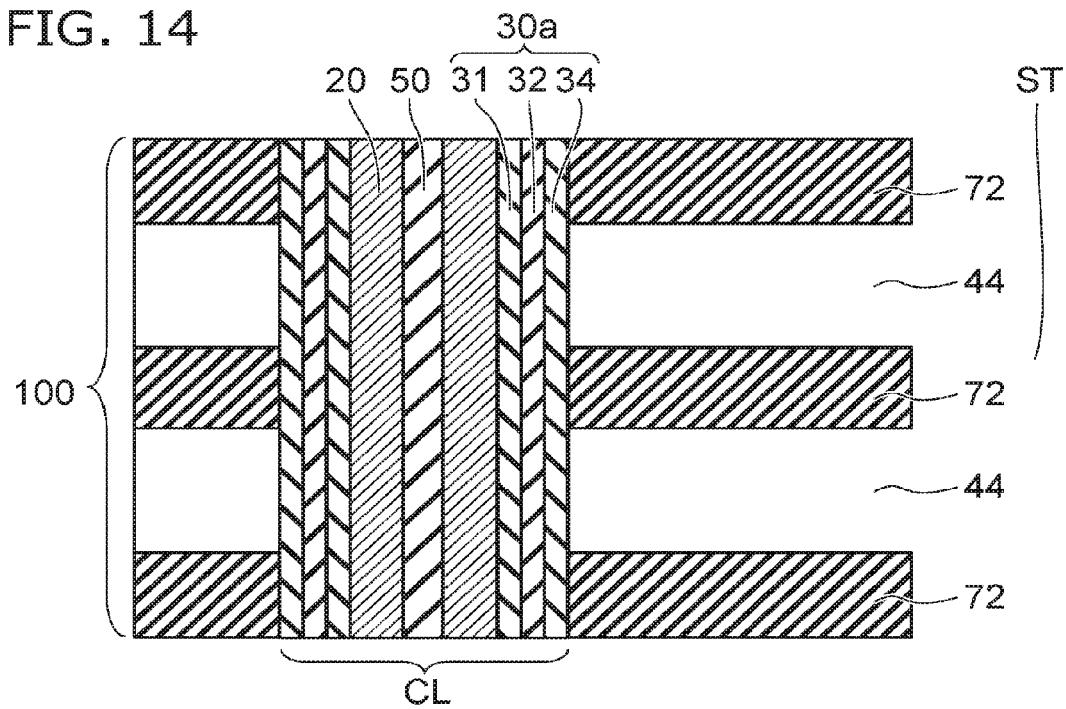
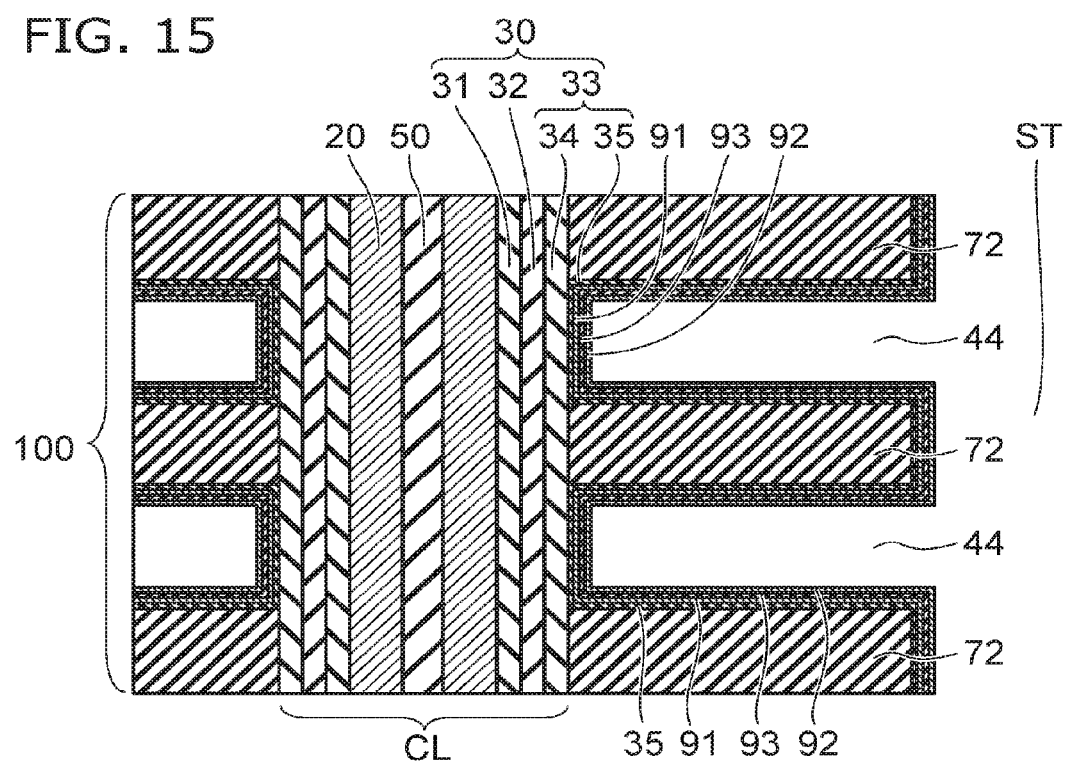

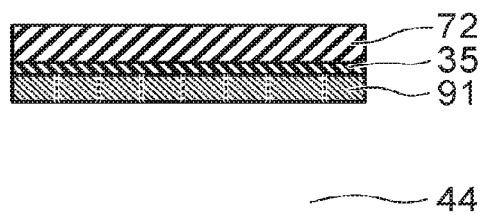
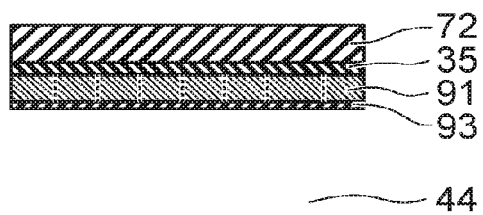
FIG. 19A      FIG. 19B
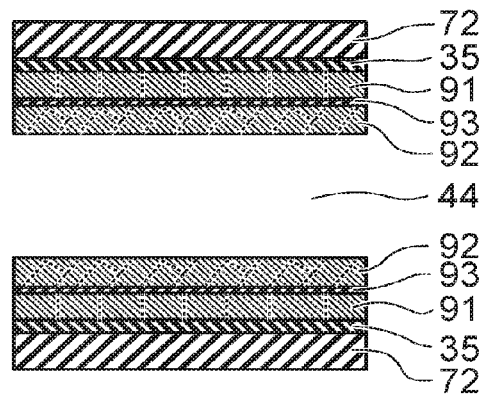
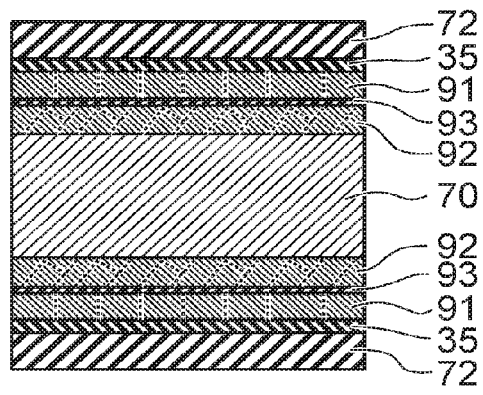
FIG. 19C      FIG. 19D

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority from U.S. Provisional Patent Application 62/279,121, filed on Jan. 15, 2016; the entire contents of which are incorporated herein by reference.

FIELD

Embodiments described herein relate generally to a semiconductor device and a method for manufacturing a semiconductor device.

BACKGROUND

A method for growing a metal layer on a metal nitride film by chemical vapor deposition (CVD) has been proposed as a method for forming an electrode layer that functions as a control gate of a three-dimensional memory device. It is desirable for the metal nitride film also to have the function of preventing the diffusion of elements contained in the metal layer.

BRIEF DESCRIPTION OF THE DRAWINGS

FIGS. 5 to 21 are schematic cross-sectional views showing a method for manufacturing the semiconductor device of the embodiment;

DETAILED DESCRIPTION

According to one embodiment, a semiconductor device includes a substrate, a stacked body stacked on the substrate, a semiconductor body extending in a stacking direction of the stacked body through the stacked body, and a stacked film including a charge storage film. The stacked body includes a plurality of metal layers, a plurality of insulating layers, a plurality of metal oxide films, a plurality of first metal nitride films, a plurality of second metal nitride films, and a plurality of intermediate films. The metal oxide films are provided between the metal layers and the insulating layers. The first metal nitride films are provided between the metal oxide films and the metal layers. The second metal nitride films are provided between the first metal nitride films and the metal layers. The intermediate films are provided between the first metal nitride films and the second metal nitride films. The intermediate films are of a different type of material from the metal oxide films. The stacked film is provided between the semiconductor body and the metal layers.

In the embodiment, for example, a semiconductor memory device is described as a semiconductor device. The semiconductor memory device includes a memory cell array having a three-dimensional structure.

Figure 1:
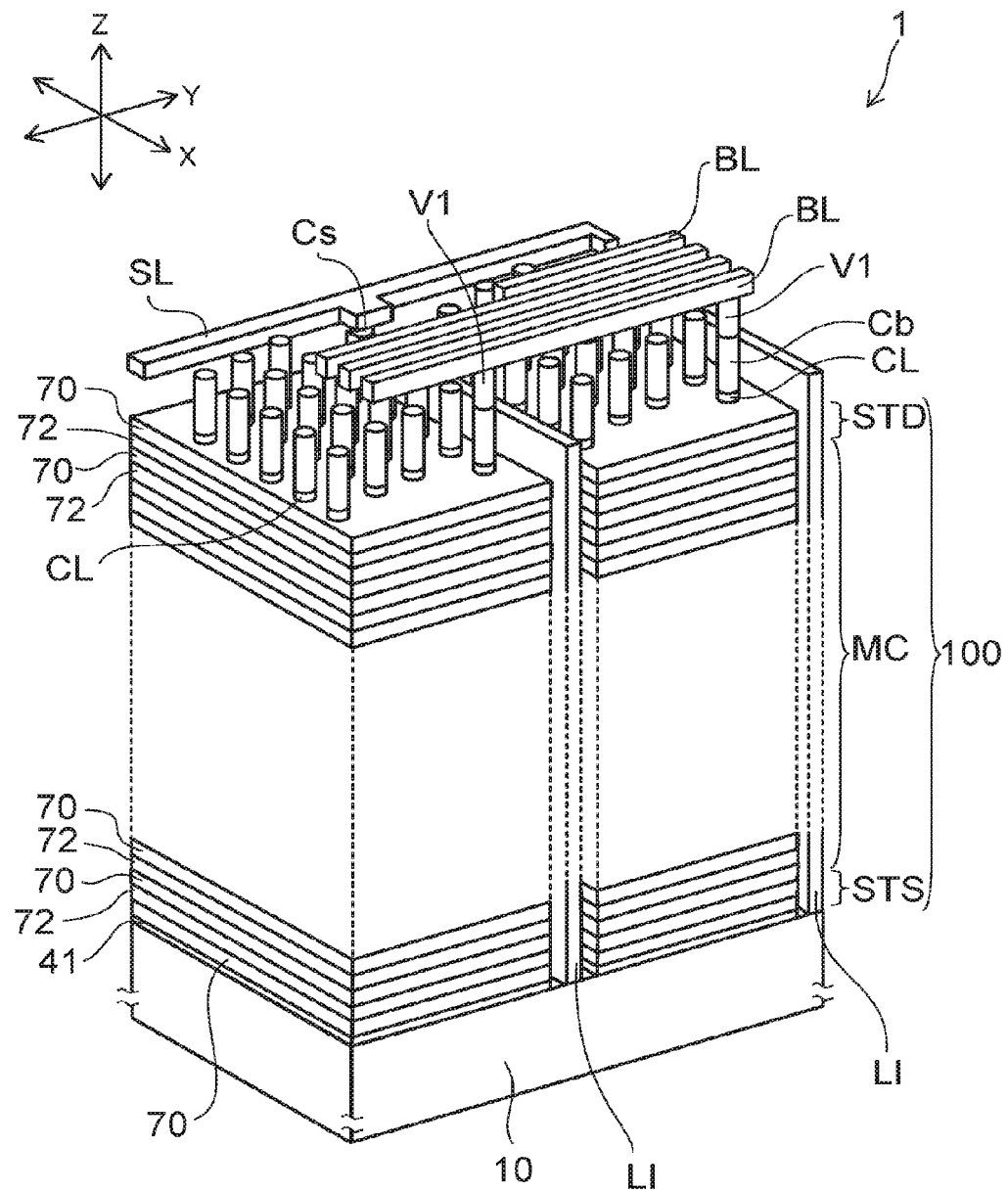
FIG. 1 is a schematic perspective view of a semiconductor device of an embodiment.

FIG. 1 is a schematic perspective view of a memory cell array 1 of the embodiment.

In FIG. 1, two mutually-orthogonal directions parallel to a major surface of a substrate 10 are taken as an X-direction and a Y-direction; and a direction orthogonal to both the X-direction and the Y-direction is taken as a Z-direction (a stacking direction).

The memory cell array 1 includes the substrate 10, a stacked body 100 stacked on the major surface of the substrate 10, multiple columnar portions CL, multiple interconnect portions LI, and upper layer interconnects provided above the stacked body 100. For example, bit lines BL and a source line SL are shown as the upper layer interconnects in FIG. 1.

The columnar portions CL are formed in circular columnar or elliptical columnar configurations extending in the stacking direction (the Z-direction) through the stacked body 100. The interconnect portions LI spread in the X-direction and the stacking direction of the stacked body 100 (the Z-direction), and divide the stacked body 100 into multiple blocks (or fingers) in the Y-direction.

For example, the multiple columnar portions CL have a staggered arrangement. Or, the multiple columnar portions CL may have a square lattice arrangement along the X-direction and the Y-direction.

The multiple bit lines BL are provided above the stacked body 100. The multiple bit lines BL are, for example, metal films extending in the Y-direction. The multiple bit lines BL are separated from each other in the X-direction.

The upper end of a semiconductor body of the columnar portion CL that is described below is connected to the bit line BL via contact units Cb and V1. The multiple columnar portions CL are connected to one common bit line BL. The multiple columnar portions CL that are connected to the common bit line BL include one columnar portion CL selected from each block divided in the Y-direction by the interconnect portion LI.

Figure 2:
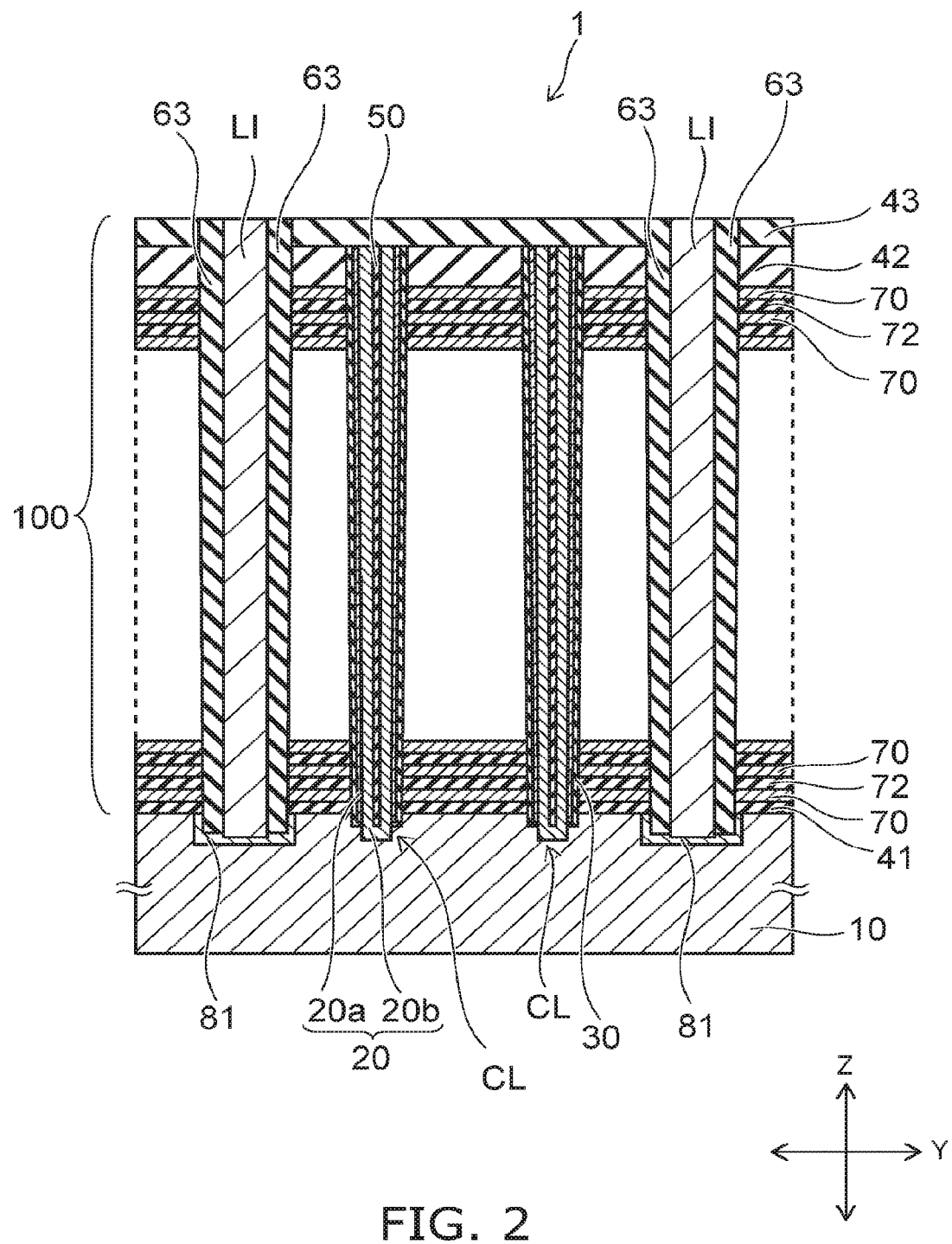
FIG. 2 is a schematic cross-sectional view of the semiconductor device of the embodiment.

FIG. 2 is a schematic cross-sectional view of the memory cell array 1. The Y-direction and the Z-direction shown in FIG. 2 respectively correspond to the Y-direction and the Z-direction shown in FIG. 1.

The stacked body 100 includes multiple metal layers 70 stacked on the major surface of the substrate 10. The multiple metal layers 70 are stacked in a direction (the Z-direction) perpendicular to the major surface of the substrate 10 with insulating layers 72 interposed. The metal layers 70 are, for example, tungsten layers or molybdenum layers.

An insulating film 41 is provided between the major surface of the substrate 10 and the metal layer 70 of the lowermost layer. An insulating film 42 is provided on the metal layer 70 of the uppermost layer; and an insulating film 43 is provided on the insulating film 42.

The columnar portion CL includes a memory film 30, a semiconductor body 20, and an insulative core film 50. The semiconductor body 20, the memory film 30, and the core film 50 extend to be continuous along the stacking direction of the stacked body 100.

The semiconductor body 20 extends in a pipe-like configuration in the stacking direction (the Z-direction) through the stacked body 100. The memory film 30 is provided between the semiconductor body 20 and the metal layers 70, and surrounds the semiconductor body 20 from the outer circumferential side. The core film 50 is provided on the inner side of the semiconductor body 20 having the pipe-like configuration. The upper end of the semiconductor body 20 is connected to the bit line BL via the contact units Cb and V1 shown in FIG. 1.

Figure 3:
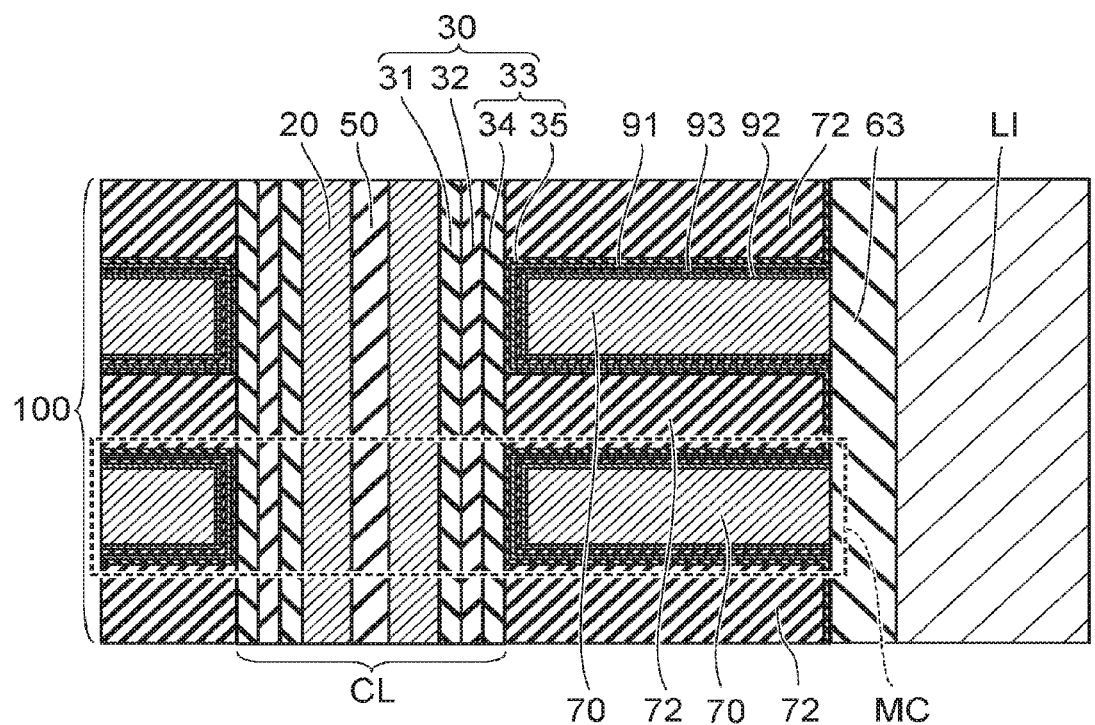
FIG. 3 is an enlarged cross-sectional view of one portion of FIG. 2.

FIG. 3 is an enlarged cross-sectional view of one portion of FIG. 2.

The memory film 30 is a stacked film including a tunneling insulating film 31, a charge storage film 32, and a blocking insulating film 33. The blocking insulating film 33, the charge storage film 32, and the tunneling insulating film 31 are provided between the semiconductor body 20 and the metal layers 70 in order from the metal layer 70 side. The tunneling insulating film 31 contacts the semiconductor body 20. The charge storage film 32 is provided between the blocking insulating film 33 and the tunneling insulating film 31.

The semiconductor body 20, the memory film 30, and the metal layer 70 are included in a memory cell MC. One memory cell MC is schematically illustrated by the broken line in FIG. 3. The memory cell MC has a vertical transistor structure in which the metal layer 70 surrounds the periphery of the semiconductor body 20 with the memory film 30 interposed.

In the memory cell MC having the vertical transistor structure, the semiconductor body 20 is, for example, a channel body of silicon; and the metal layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film. The charge storage film 32 includes, for example, a silicon nitride film. Or, the charge storage film 32 may be a conductive floating gate surrounded with an insulator.

The tunneling insulating film 31 is a potential barrier when charge is injected from the semiconductor body 20 into the charge storage film 32 or when the charge stored in the charge storage film 32 is released into the semiconductor body 20. The tunneling insulating film 31 includes, for example, a silicon oxide film.

The blocking insulating film 33 prevents the charge stored in the charge storage film 32 from being released into the metal layer 70. Also, the blocking insulating film 33 prevents back-tunneling of electrons from the metal layer 70 into the columnar portion CL.

The blocking insulating film 33 includes a first blocking film 34 and a second blocking film 35. The first blocking film 34 contacts the charge storage film 32 and extends to be continuous in the stacking direction of the stacked body 100. The second blocking film 35 is provided between the first blocking film 34 and the metal layer 70, and contacts the first blocking film 34. The first blocking film 34 is a silicon oxide film; and the second blocking film 35 is a metal oxide film having a higher dielectric constant than that of the silicon oxide film. For example, the second blocking film 35 is an aluminum oxide film.

The second blocking film 35 is provided also between the metal layer 70 and the insulating layer 72. The second blocking film 35 contacts the lower surface and upper surface of the insulating layer 72. The second blocking film 35 between the metal layer 70 and the first blocking film 34 and the second blocking film 35 between the metal layer 70 and the insulating layer 72 are formed to be continuous as one body.

A first metal nitride film 91, an intermediate film 93, and a second metal nitride film 92 are provided between the metal layer 70 and the second blocking film 35.

The second metal nitride film 92 is provided on the upper surface and lower surface of the metal layer 70 and on the side surface of the metal layer 70 on the columnar portion CL side. The second metal nitride film 92 contacts the upper surface, the lower surface, and the side surface of the metal layer 70.

The first metal nitride film 91 and the intermediate film 93 are provided between the second metal nitride film 92 and the second blocking film 35. The first metal nitride film 91 contacts the second blocking film 35. The intermediate film 93 is provided between the first metal nitride film 91 and the second metal nitride film 92.

The first metal nitride film 91, the intermediate film 93, and the second metal nitride film 92 are formed continuously along the upper surface and lower surface of the metal layer 70 and along the side surface of the metal layer 70 on the columnar portion CL side.

The second blocking film 35, the first metal nitride film 91, the intermediate film 93, and the second metal nitride film 92 are provided between the first blocking film 34 and the metal layer 70. The second blocking film 35, the first metal nitride film 91, the intermediate film 93, and the second metal nitride film 92 are provided between the insulating layer 72 and the metal layer 70.

The first metal nitride film 91 and the second metal nitride film 92 are not formed on the side surface of the stacked body 100 on the interconnect portion LI side, and are divided in the vertical direction (the stacking direction of the stacked body 100). Accordingly, the metal layers 70 of different layers are not shorted to each other via the first metal nitride film 91 and the second metal nitride film 92.

As shown in FIG. 1, a drain-side selection transistor STD is provided in the upper layer portion of the stacked body 100 (the upper end portion of the columnar portion CL). A source-side selection transistor STS is provided in the lower layer portion of the stacked body 100 (the lower end portion of the columnar portion CL). At least the metal layer 70 of the uppermost layer functions as a control gate of the drain-side selection transistor STD. At least metal layer 70 of the lowermost layer functions as a control gate of the source-side selection transistor STS.

The multiple memory cells MC are provided between the drain-side selection transistor STD and the source-side selection transistor STS. The multiple memory cells MC, the drain-side selection transistor STD, and the source-side selection transistor STS are connected in series via the semiconductor body 20, and are included in one memory string. For example, the memory strings have a staggered arrangement in a planar direction parallel to the X-Y plane; and the multiple memory cells MC are provided three-dimensionally in the X-direction, the Y-direction, and the Z-direction.

As shown in FIG. 1, the interconnect portion LI spreads in the X-direction and the Z-direction, and is, for example, a film containing a metal. As shown in FIG. 2, an insulating film 63 is provided on the side surface of the interconnect portion LI. The insulating film 63 is provided between the stacked body 100 and the interconnect portion LI.

The upper end of the interconnect portion LI is connected to the source line SL via a contact Cs shown in FIG. 1.

The lower end of the interconnect portion LI contacts the substrate 10. Also, the lower end of the semiconductor body 20 contacts the substrate 10. The substrate 10 is, for example, a conductive silicon substrate that is doped with an impurity.

A semiconductor region 81 is formed in the front surface of the substrate 10 reached by the lower end of the interconnect portion LI. The multiple semiconductor regions 81 are provided to correspond to the multiple interconnect portions LI. The multiple semiconductor regions 81 include a p-type semiconductor region 81 and an n-type semiconductor region 81. The p-type semiconductor region 81 supplies holes to the semiconductor body 20 via the substrate 10 in the erasing operation. Electrons are supplied from the interconnect portion LI to the semiconductor body 20 via the n-type semiconductor region 81 and the substrate 10 in the read-out operation.

By the potential control applied to the metal layer 70 of the lowermost layer provided on the front surface (the major surface) of the substrate 10 with the insulating film 41 interposed, a channel is induced in the front surface of the substrate 10 between the semiconductor region 81 and the lower end of the semiconductor body 20; and a current can be caused to flow between the semiconductor region 81 and the lower end of the semiconductor body 20.

The metal layer 70 of the lowermost layer functions as a control gate for inducing the channel in the front surface of the substrate 10; and the insulating film 41 functions as a gate insulator film.

Figure 4:
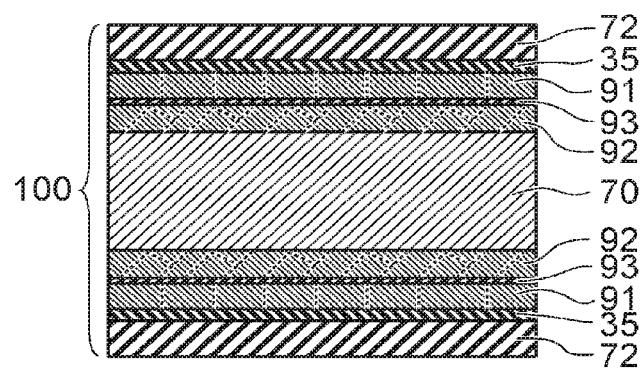
FIG. 4 is an enlarged cross-sectional view of one portion of FIG. 3.

FIG. 4 is a schematic enlarged cross-sectional view of one portion of the stacked body 100.

Both the first metal nitride film 91 and the second metal nitride film 92 are crystalline films, and are, for example, titanium nitride films. In FIG. 4, the crystal grain boundaries of the first metal nitride film 91 and the second metal nitride film 92 are schematically illustrated by broken lines.

The first metal nitride film 91 is a monocrystalline film having a crystal structure in which any crystal orientation substantially does not change at any position in the crystal. In such a first metal nitride film 91, as illustrated by the broken lines in FIG. 4, columnar crystals are formed in which the directions of the crystal grain boundaries extending between the second blocking film 35 and the intermediate film 93 are aligned in substantially straight line configurations. The crystallinity and crystal orientation of the metal nitride film are affected by the foundation material.

For example, a titanium nitride film (a TiN film) as the first metal nitride film 91 formed on an aluminum oxide film (an $Al_2O_3$ film) as the second blocking film 35 has a crystal orientation distribution having one large peak at (220) according to a diffraction measurement typified by X-ray analysis or electron diffraction such as RHEED (Reflection High Energy Electron Diffraction), etc.

The major orientation of the surface of the first metal nitride film 91 (the titanium nitride film) along the interface with the second blocking film 35 (the aluminum oxide film) is (220). A major orientation of (220) means that the diffraction intensity of the plane orientation of (220) is most intense for the diffraction measurement recited above for the first metal nitride film 91 (the titanium nitride film).

Conversely, the second metal nitride film 92 has a polycrystalline structure including multiple microcrystals. The crystal orientations of the multiple microcrystals of the polycrystalline structure are generally oriented in random directions. Therefore, as shown in FIG. 4, the directions of the crystal grain boundaries of the second metal nitride film 92 extending between the intermediate film 93 and the metal layer 70 are irregular.

For example, a titanium nitride film (a TiN film) as the second metal nitride film 92 formed on a silicon oxide film (a $SiO_2$ film) as the intermediate film 93 has a crystal orientation distribution having peaks at (111), (200), and (220) in the diffraction measurement recited above.

The surface of the second metal nitride film 92 (the titanium nitride film) along the interface with the intermediate film 93 (the silicon oxide film) has three major orientations of (111), (200), and (220).

As described below, such a second metal nitride film 92 impedes the diffusion into the insulating layer 72 of the elements other than the major component metal contained inside the metal layer 70.

A method for manufacturing the semiconductor device of the embodiment will now be described with reference to FIG. 5 to FIG. 21. FIG. 14 to FIG. 18 show enlarged cross sections of one portion of the stacked body 100. FIG. 19A to FIG. 19D show schematic cross sections corresponding to FIG. 4 described above.

Figure 5:
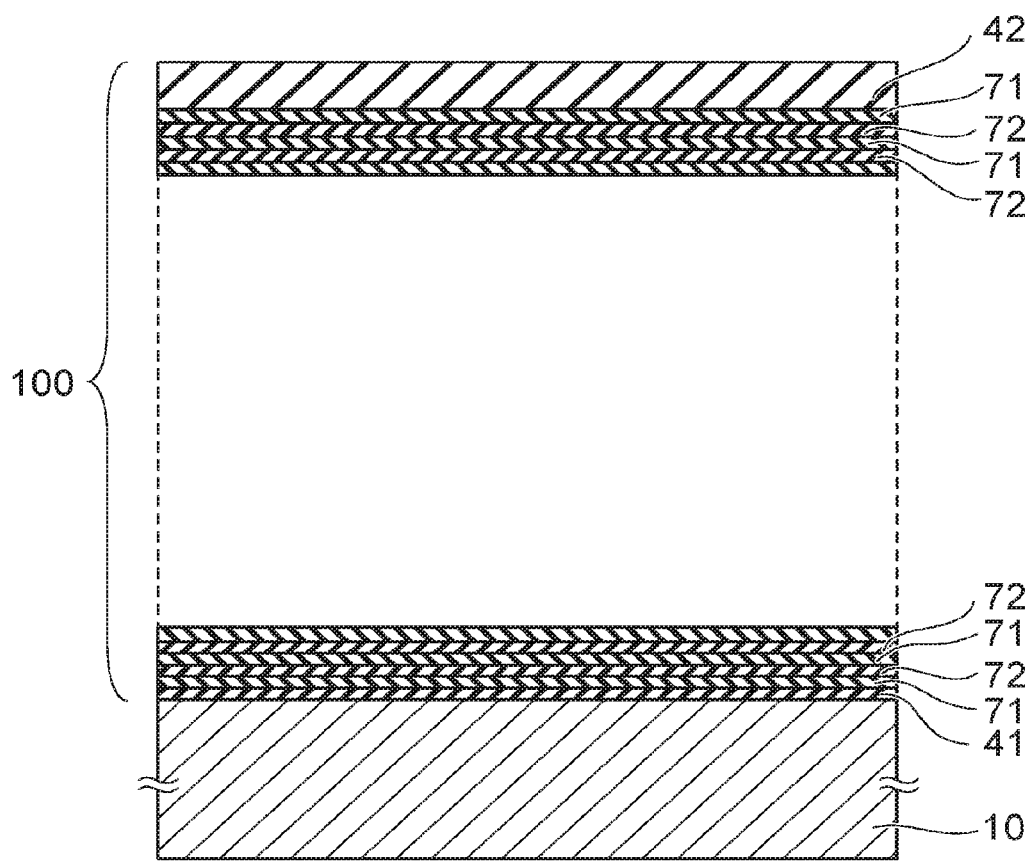

As shown in FIG. 5, the stacked body 100 is formed on the substrate 10. The insulating film 41 is formed on the major surface (the front surface) of the substrate 10; and a sacrificial layer 71 as a first layer and the insulating layer 72 as a second layer are stacked alternately on the insulating film 41. The multiple sacrificial layers 71 and the multiple insulating layers 72 are formed on the substrate 10 by repeating the process of alternately stacking the sacrificial layer 71 and the insulating layer 72. For example, the sacrificial layer 71 is a silicon nitride layer; and the insulating layer 72 is a silicon oxide layer.

The sacrificial layer 71 of the lowermost layer is formed on the insulating film 41; and the insulating layer 72 of the lowermost layer is formed on the sacrificial layer 71 of the lowermost layer. The insulating film 42 is formed on the sacrificial layer 71 of the uppermost layer.

Figure 6:
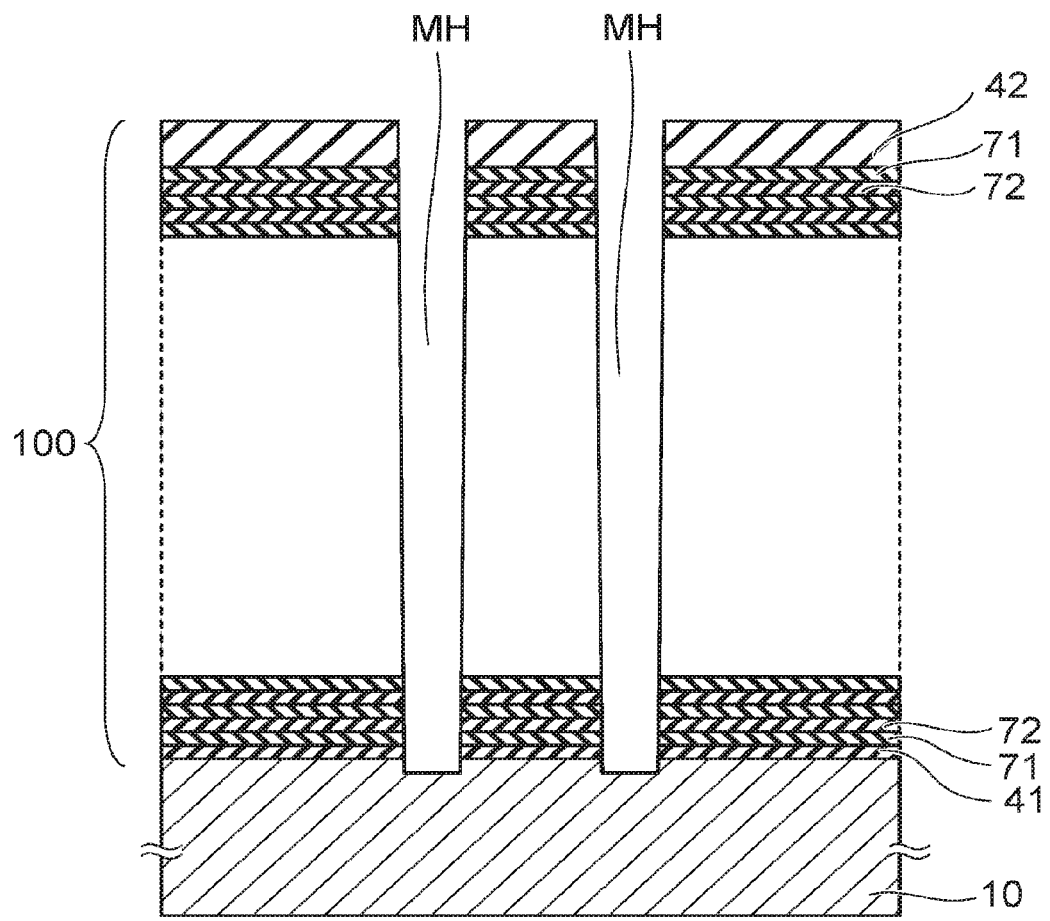

Then, as shown in FIG. 6, multiple memory holes MH are made in the stacked body 100. The memory holes MH are made by reactive ion etching (RIE) using a not-shown mask. The memory holes MH extend in the stacking direction of the stacked body 100 (the Z-direction) and reach the substrate 10.

Figure 7:
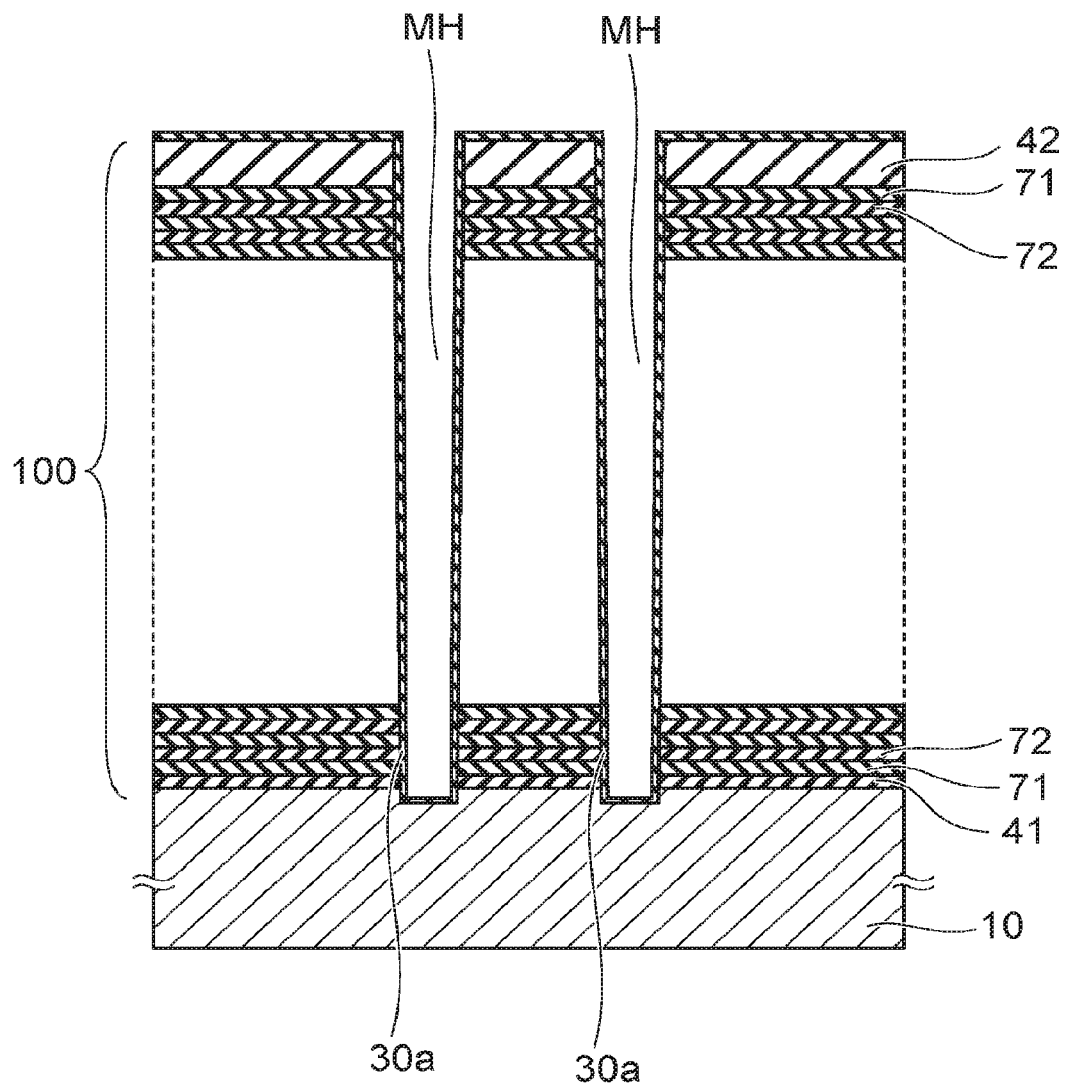

As shown in FIG. 7, a stacked film 30a is formed inside the memory holes MH. The stacked film 30a includes the tunneling insulating film 31, the charge storage film 32, and the first blocking film 34 of the memory film 30 shown in FIG. 3. The stacked film 30a is formed conformally along the side surfaces and bottoms of the memory holes MH.

Figure 8:
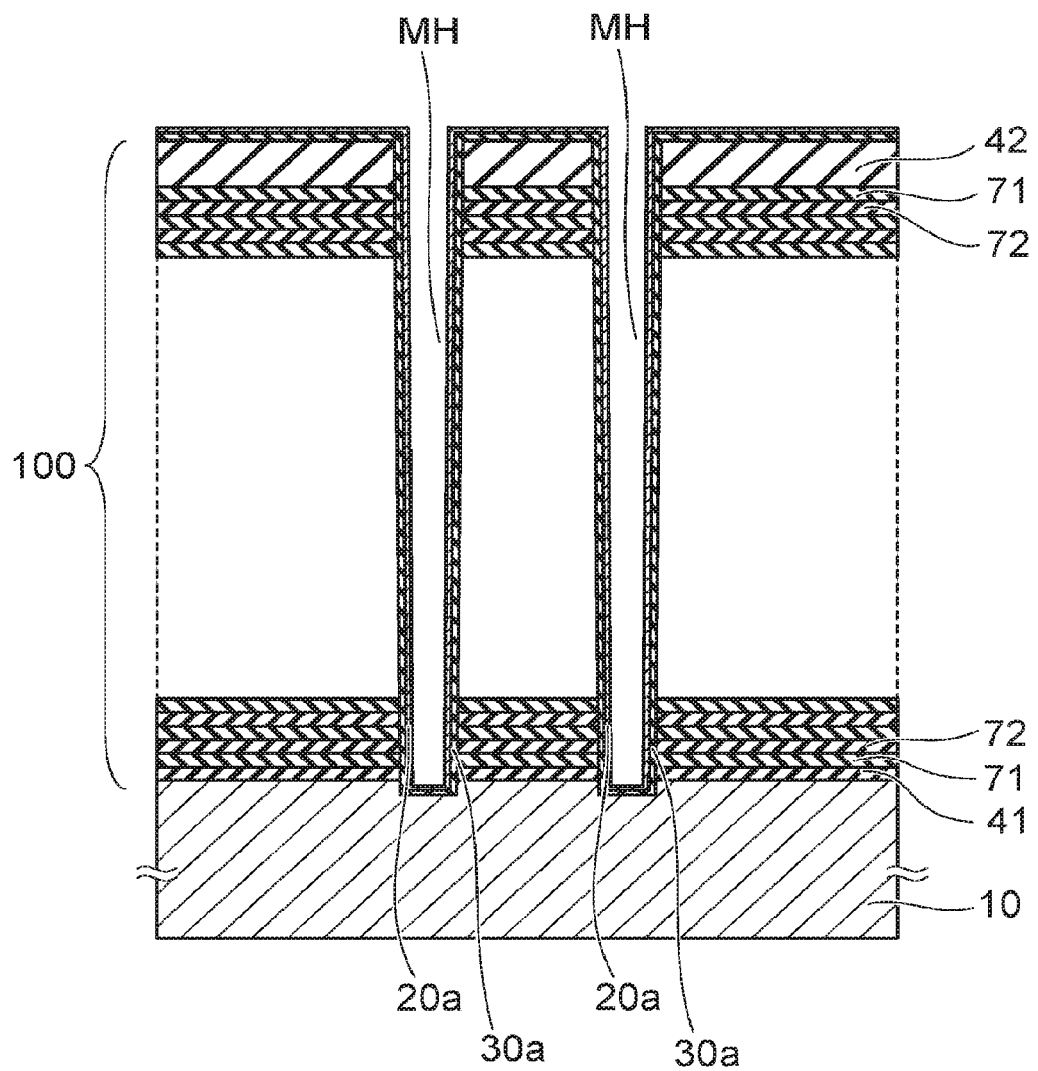

As shown in FIG. 8, a cover film 20a is formed on the inner side of the stacked film 30a. The cover film 20a is formed conformally along the side surfaces and bottoms of the memory holes MH.

Figure 9:
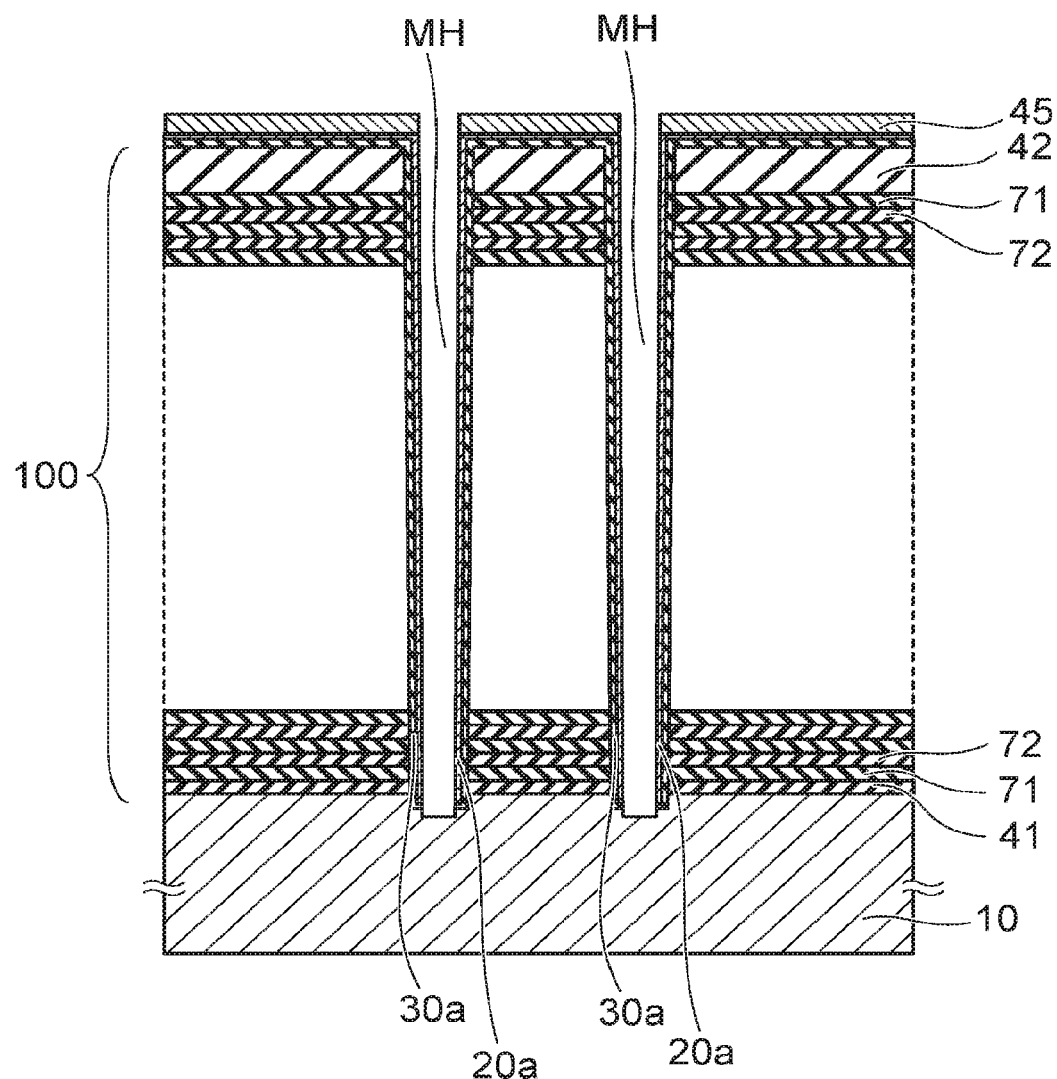

Then, as shown in FIG. 9, a mask layer 45 is formed on the upper surface of the stacked body 100; and the cover film 20a and the stacked film 30a deposited on the bottoms of the memory holes MH are removed by RIE. In the RIE, the stacked film 30a formed on the side surfaces of the memory holes MH is covered with and protected by the cover film 20a and is not damaged by the RIE.

Figure 10:
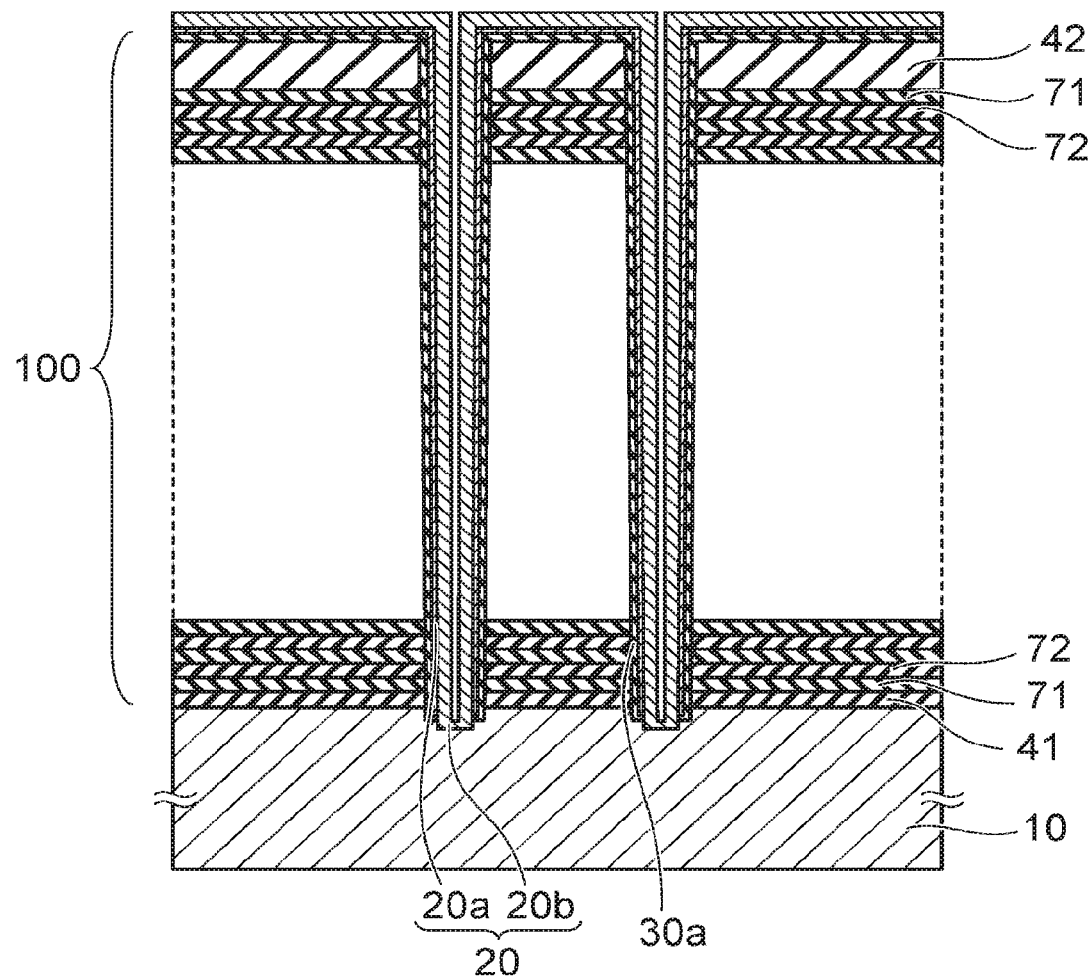

After the mask layer 45 is removed, as shown in FIG. 10, a semiconductor film 20b is formed inside the memory holes MH. The semiconductor film 20b is formed on the side surface of the cover film 20a and the bottoms of the memory holes MH where the substrate 10 is exposed.

For example, the cover film 20a and the semiconductor film 20b are crystallized into polycrystalline silicon films by heat treatment after being formed as amorphous silicon films. The cover film 20a and the semiconductor film 20b are included in the semiconductor body 20 described above.

Figure 11:
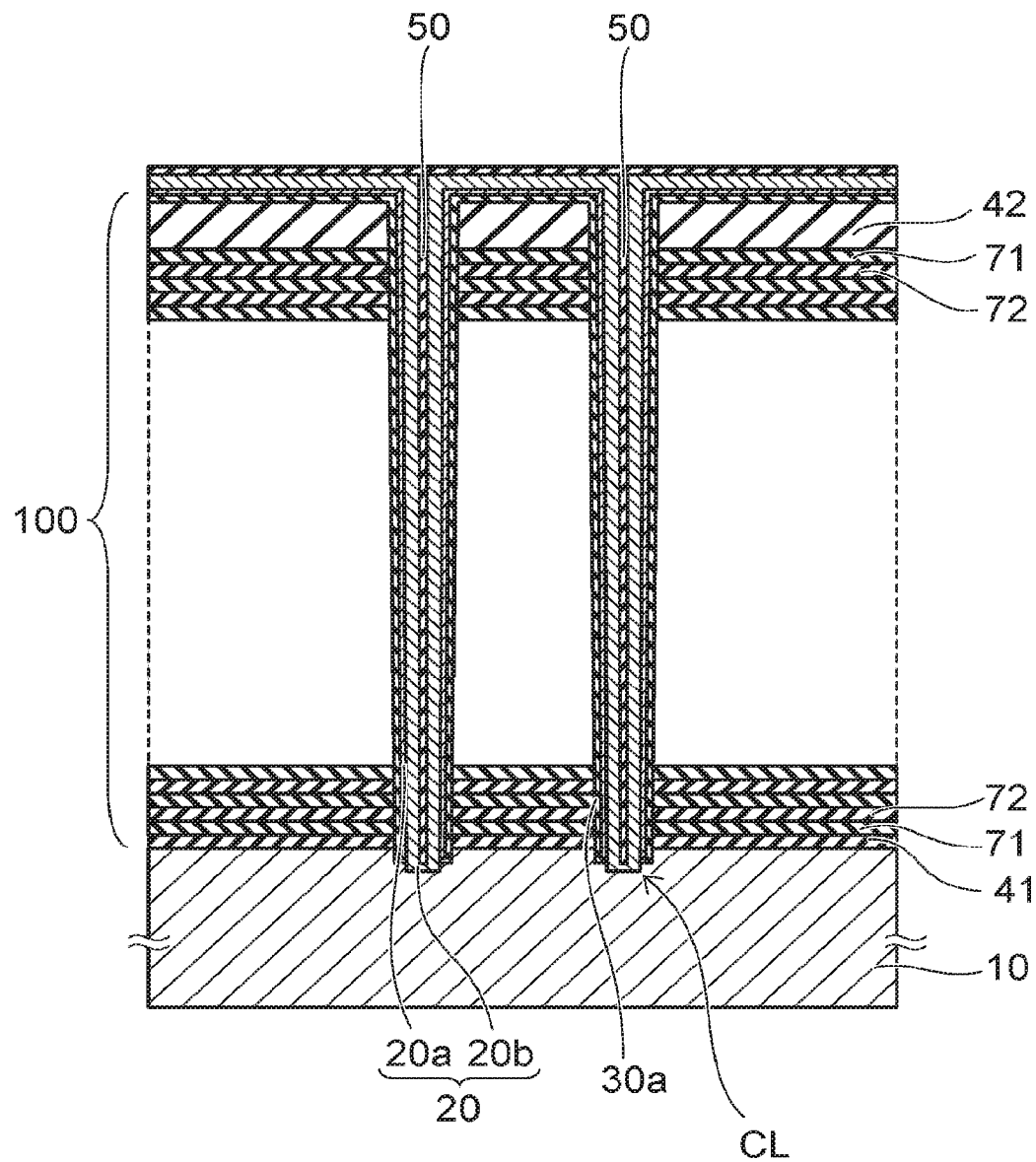

As shown in FIG. 11, the core film 50 is formed on the inner side of the semiconductor film 20b. The multiple columnar portions CL that include the stacked film 30a, the semiconductor body 20, and the core film 50 are formed inside the stacked body 100.

Figure 12:
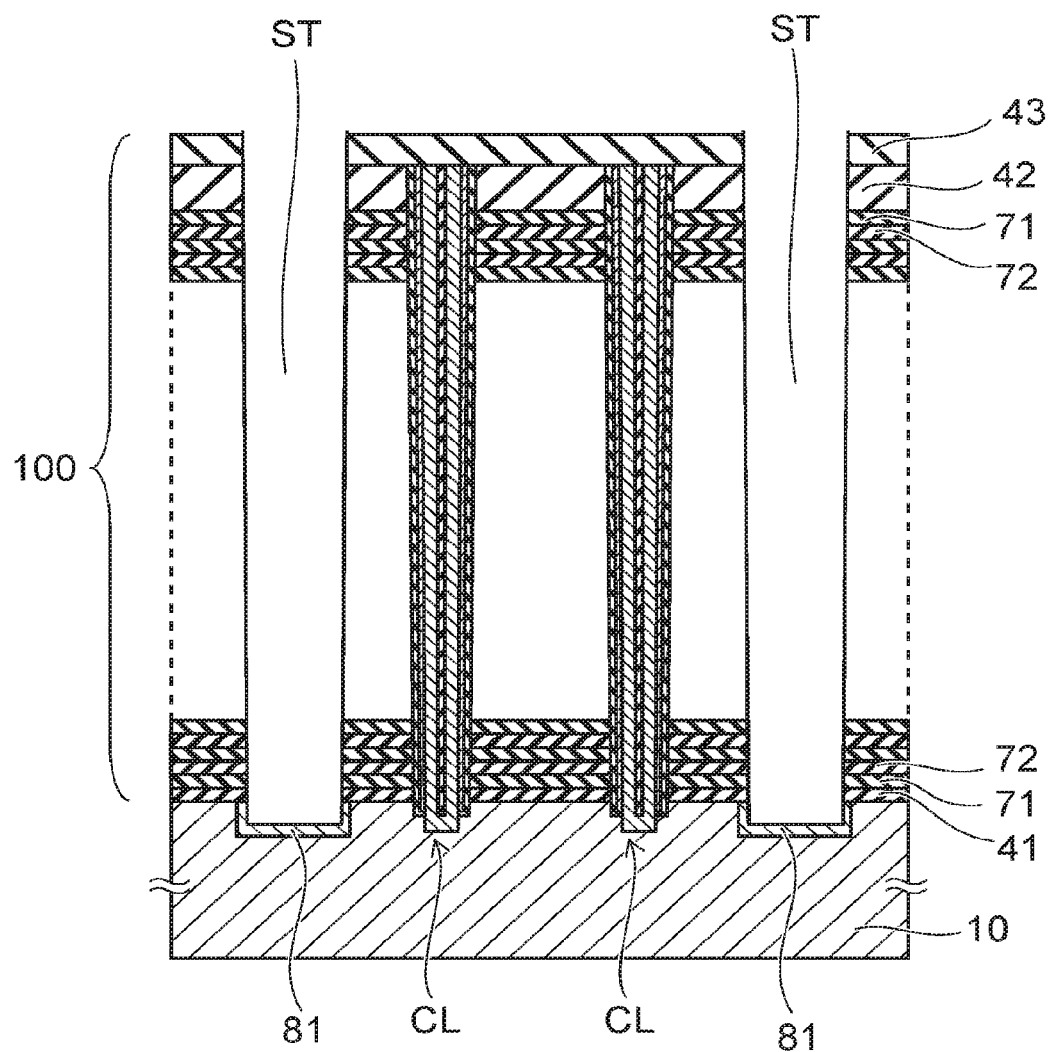

Films deposited on the insulating film 42 shown in FIG. 11 are removed by chemical mechanical polishing (CMP) or etch-back. Subsequently, as shown in FIG. 12, the insulating film 43 is formed on the insulating film 42. The insulating film 43 covers the upper ends of the columnar portions CL.

Then, multiple slits ST that extend in the stacking direction are made in the stacked body 100. The multiple slits ST are made in the stacked body 100 including the insulating film 43, the insulating film 42, the sacrificial layers 71, the insulating layers 72, and the insulating film 41 by RIE using a not-shown mask. The slits ST pierce the stacked body 100 and reach the substrate 10.

An impurity is implanted by ion implantation into the substrate 10 exposed at the bottoms of the slits ST. The p-type or n-type semiconductor region 81 is formed in the front surface of the substrate 10 at the bottoms of the slits ST.

Then, the sacrificial layers 71 are removed by an etchant or an etching gas supplied through the slits ST. For example, the sacrificial layers 71 which are silicon nitride layers are removed using an etchant containing phosphoric acid.

Figure 13:
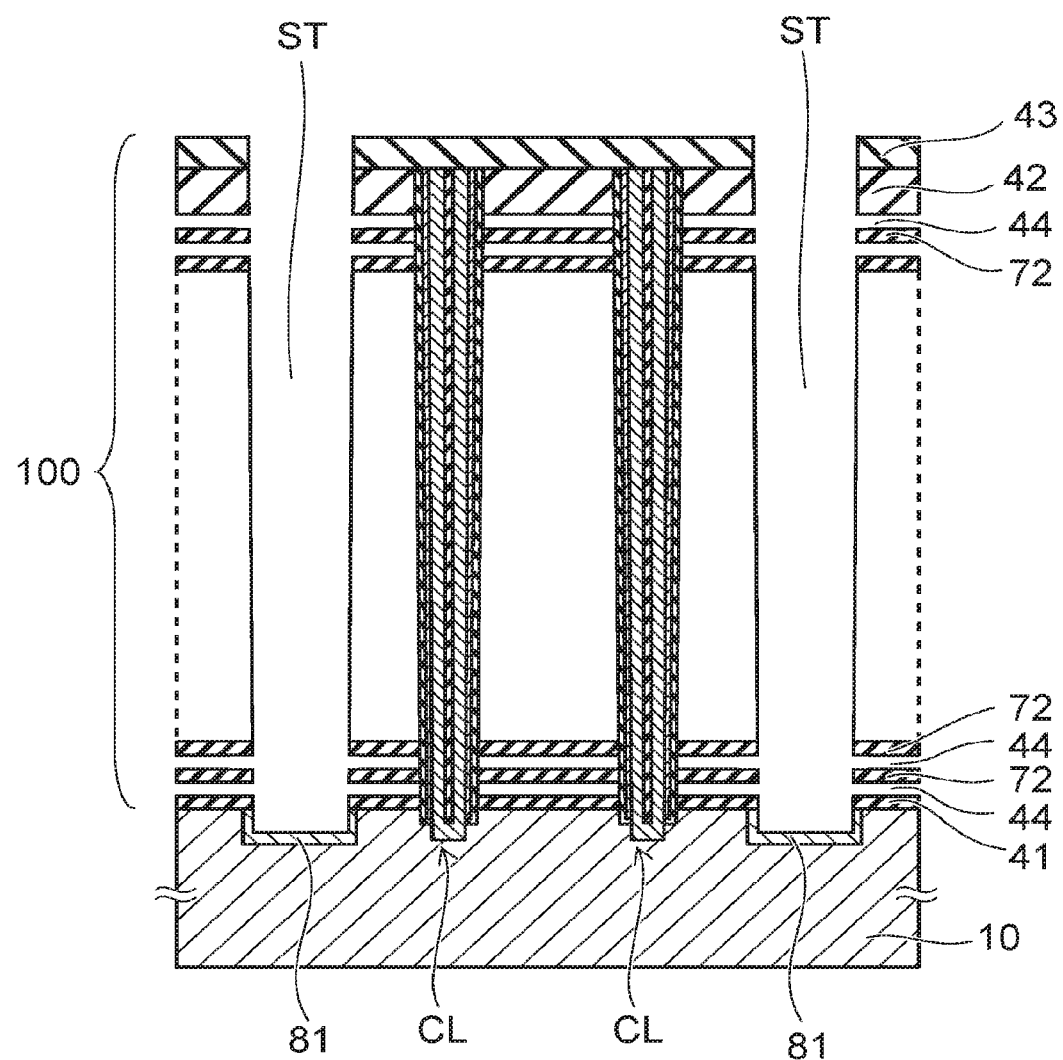

The sacrificial layers 71 are removed; and as shown in FIG. 13 and FIG. 14, a gap 44 is made between the insulating layers 72 adjacent to each other above and below. As shown in FIG. 13, the gap 44 is made also between the insulating film 41 and the insulating layer 72 of the lowermost layer, and between the insulating film 42 and the insulating layer 72 of the uppermost layer.

The multiple insulating layers 72 that are separated from each other in the stacking direction with the gap 44 interposed are supported by the columnar portions CL. Also, the lower ends of the columnar portions CL are supported by the substrate 10; and the upper ends of the columnar portions CL are supported by the insulating film 42 and the insulating film 43.

As shown in FIG. 14, the upper surfaces and lower surfaces of the insulating layers 72 are exposed in the gap 44. Also, the side surface of the stacked film 30a (the side surface of the first blocking film 34) is exposed in the gap 44.

As shown in FIG. 15, the second blocking film 35, the first metal nitride film 91, the intermediate film 93, and the second metal nitride film 92 are formed in order inside the gap 44. For example, the second blocking film 35, the first metal nitride film 91, the intermediate film 93, and the second metal nitride film 92 are formed by CVD.

As shown in FIG. 15 and FIG. 19A, the second blocking film 35 is formed on the surfaces (the upper surface and the lower surface) of the insulating layer 72 opposing the gap 44. As shown in FIG. 15, the second blocking film 35 is formed also on the side surface of the first blocking film 34 opposing the gap 44 and the side surface of the insulating layer 72 exposed in the slit ST.

As shown in FIG. 15 and FIG. 19A, the first metal nitride film 91 is formed on the inner side of the second blocking film 35 (the surface exposed in the gap 44). As shown in FIG. 15, the first metal nitride film 91 is formed also on the side surface of the second blocking film 35 on the slit ST side.

As shown in FIG. 15 and FIG. 19B, the intermediate film 93 is formed on the inner side of the first metal nitride film 91 (the surface exposed in the gap 44). As shown in FIG. 15, the intermediate film 93 is formed also on the side surface of the first metal nitride film 91 on the slit ST side.

As shown in FIG. 15 and FIG. 19C, the second metal nitride film 92 is formed on the inner side of the intermediate film 93 (the surface exposed in the gap 44). As shown in FIG. 15, the second metal nitride film 92 is formed also on the side surface of the intermediate film 93 on the slit ST side.

The second blocking film 35, the first metal nitride film 91, the intermediate film 93, and the second metal nitride film 92 are formed continuously and conformally along the upper surface and lower surface of the insulating layer 72, the side surface of the insulating layer 72 on the slit ST side, and the side surface of the first blocking film 34.

Figure 16:
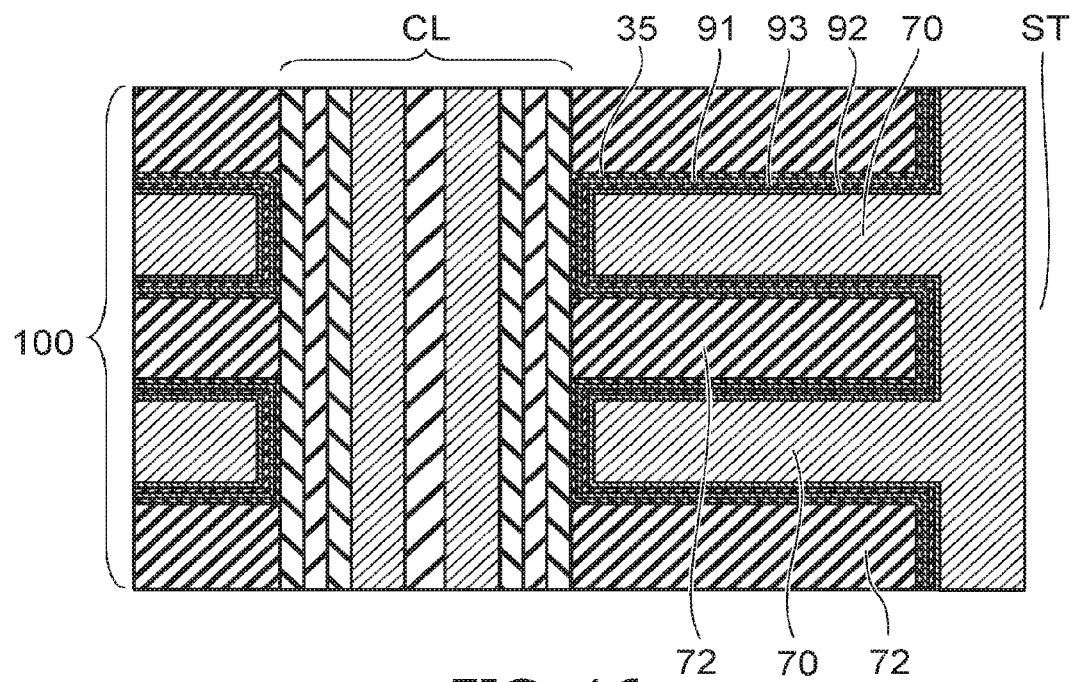

The gap 44 remains on the inner side of the second metal nitride film 92 between the insulating layer 72 and the insulating layer 72 adjacent to each other above and below. As shown in FIG. 16 and FIG. 19D, the metal layer 70 is formed inside the gap 44.

As the metal layer 70, for example, a tungsten layer or a molybdenum layer is formed by CVD. The gas used in the CVD enters the gap 44 through the slits ST.

It is difficult to perform vapor phase epitaxy of the tungsten layer or the molybdenum layer on the insulating film by CVD and difficult to form the tungsten layer or the molybdenum layer with good adhesion. In the embodiment, because the metal layer (the tungsten layer or the molybdenum layer) 70 is formed on the metal nitride film (the second metal nitride film 92), the metal layer 70 having good adhesion can be formed on the foundation (the second metal nitride film 92).

For example, the process of forming the tungsten layer by CVD as the metal layer 70 includes a process of forming a tungsten initial film that is a microcrystal or has low crystallinity on the surface of the second metal nitride film 92, and a process of forming a tungsten layer that has a large grain size and is thicker than the initial film on the inner side of the initial film.

For example, the initial film is formed by the reaction of tungsten fluoride ($WF_6$) gas which is a source gas of tungsten and diborane ($B_2H_6$) gas as a reducing gas. Subsequently, the tungsten layer is formed on the inner side of the initial film by the reaction of the $WF_6$ gas and hydrogen ($H_2$) gas as a reducing gas.

When forming the molybdenum layer as the metal layer 70 as well, for example, the initial film of molybdenum is formed using molybdenum fluoride ($MoF_6$) gas and diborane ($B_2H_6$) gas; and subsequently, the molybdenum layer can be formed using the $MoF_6$ gas and hydrogen ($H_2$) gas.

Such a metal layer (the tungsten layer or the molybdenum layer) 70 formed by CVD contains fluorine and boron other than the major component metal (the tungsten or the molybdenum).

Because the initial film is formed on the surface of the second metal nitride film 92 in the initial film formation of the metal layer 70, the crystallinity of the tungsten or the molybdenum formed on the inner side of the initial film can be different from the crystallinity of the second metal nitride film 92. The crystallinity of the second metal nitride film 92 is not affected by the crystallinity of the metal layer 70. This promotes a larger grain size of the tungsten or the molybdenum by a $H_2$ reduction reaction, and reduces the resistance of the metal layer 70.

Figure 22A:
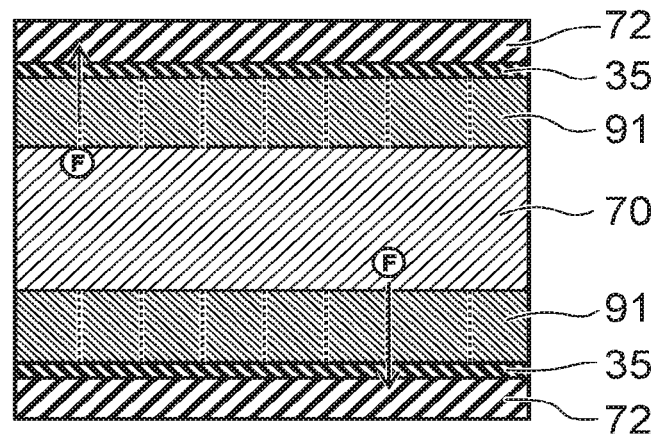
FIG. 22A is a schematic cross-sectional view of a different semiconductor device from the semiconductor device of the embodiment.

As a comparative example, as shown in FIG. 22A, even in the case where the metal layer 70 is formed on the first metal nitride film 91 by CVD, it is possible to form the metal layer 70 on the first metal nitride film 91 with good adhesion.

However, for example, as described above, for the titanium nitride film as the first metal nitride film 91 formed on the second blocking film 35 which is the aluminum oxide film, the titanium nitride film is a monocrystalline film having a major orientation of (220); and the directions of the crystal grain boundaries (schematically illustrated by the broken lines in FIG. 22A) extending between the second blocking film 35 and the intermediate film 93 undesirably align in substantially straight line configurations.

At the crystal grain boundary which is the boundary between the adjacent crystal grains (crystal lattices), compared to the crystal grain interior, the atoms are sparse and movement of the atoms occurs easily due to the disorder of the atomic arrangement. Therefore, in the heat treatment processes performed in processes after the metal layer 70 is formed, the fluorine (F) contained in the metal layer 70 easily diffuses into the insulating layer 72 through the crystal grain boundaries of the first metal nitride film 91 (the titanium nitride film) that are aligned in the straight line configuration.

In the case where hydrofluoric acid (HF) is generated by the fluorine (F) bonding to the hydrogen (H) of moisture incorporated inside the insulating layer 72, the insulating layer 72 which is the silicon oxide layer is etched locally by the hydrofluoric acid; and the insulating layer 72 may degrade.

Figure 22B:
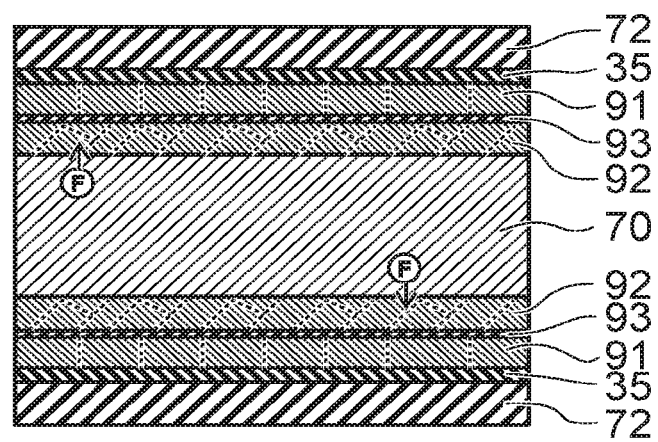
FIG. 22B is a schematic cross-sectional view of the semiconductor device of the embodiment.

Therefore, according to the embodiment, as shown in FIG. 22B, after the first metal nitride film 91 is formed, the intermediate film 93 is formed on the first metal nitride film 91. For example, a silicon oxide film (a $SiO_2$ film) is formed as the intermediate film 93 by CVD. Because it is difficult to perform vapor phase epitaxy by CVD or to obtain the formation with good adhesion for the metal layer (the tungsten layer or the molybdenum layer) 70 on the silicon oxide film, the second metal nitride film 92 is formed on the intermediate film 93.

For example, a titanium nitride film as the second metal nitride film 92 is formed on the intermediate film 93 which is the silicon oxide film. As described above, such a second metal nitride film (titanium nitride film) 92 is, for example, a polycrystalline film having three major orientations of (111), (200), and (220); and the directions of the crystal grain boundaries (schematically illustrated by the broken lines in FIG. 22B) extending between the intermediate film 93 and the metal layer 70 are irregular.

Therefore, the fluorine inside the metal layer 70 does not easily pass through into the insulating layer 72 through the crystal grain boundary of the second metal nitride film 92. The diffusion prevention of the fluorine into the insulating layer 72 prevents the degradation of the insulating layer 72.

In the case where the silicon oxide film (the intermediate film 93) is formed directly on the second blocking film (the aluminum oxide film) 35, there is a possibility of film property degradation of the second blocking film 35 such as oxygen deficiency, etc., due to the oxygen inside the second blocking film (the aluminum oxide film) 35 bonding to the Si of the silicon oxide film.

According to the embodiment, the first metal nitride film 91 is formed between the second blocking film 35 and the intermediate film 93; and the second blocking film 35 and the intermediate film 93 do not contact. Therefore, the oxygen deficiency of the second blocking film 35 due to the oxygen inside the second blocking film (the aluminum oxide film) 35 bonding to the silicon inside the intermediate film (the silicon oxide film) 93 can be prevented. This prevents the film property degradation of the second blocking film 35 formed between the metal layer 70 and the side surface of the columnar portion CL that affects the characteristics of the memory cell MC shown in FIG. 3.

Boron also is contained in the metal layer 70 due to the reducing gas described above; and the irregular crystal grain boundary of the second metal nitride film 92 also is effective for the diffusion prevention of the boron into the insulating layer 72.

In the case where the first metal nitride film 91 is a titanium nitride film, the intermediate film 93 may be a titanium oxide film. The titanium oxide film can be formed by oxidizing the surface of the first metal nitride film (the titanium nitride film) 91 by exposing the surface to ambient air. For example, the first metal nitride film 91 can be exposed to ambient air by returning the wafer to the wafer transfer container from the chamber (a vacuum or a reduced-pressure atmosphere) in which the first metal nitride film (the titanium nitride film) 91 is formed.

For example, a titanium nitride film is formed as the second metal nitride film 92 on the intermediate film (the titanium oxide film) 93. The titanium nitride film formed on the titanium oxide film also has a polycrystalline structure similar to that of the titanium nitride film formed on the silicon oxide film; and the directions in which the crystal grain boundaries extend are irregular.

Figure 20:
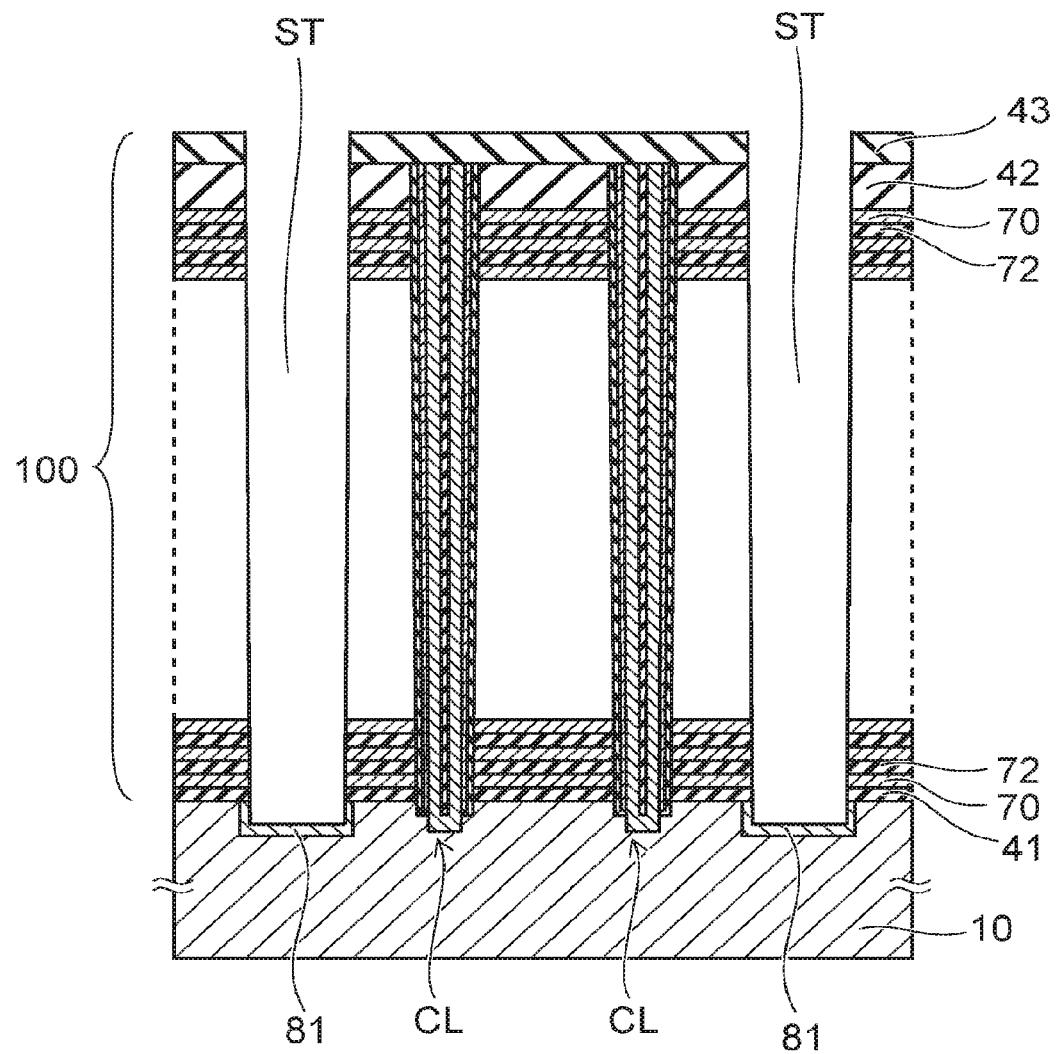

As shown in FIG. 20, the metal layer 70 is formed between the insulating layers 72 adjacent to each other above and below, between the insulating film 41 and the insulating layer 72 of the lowermost layer, and between the insulating film 42 and the insulating layer 72 of the uppermost layer.

Figure 17:
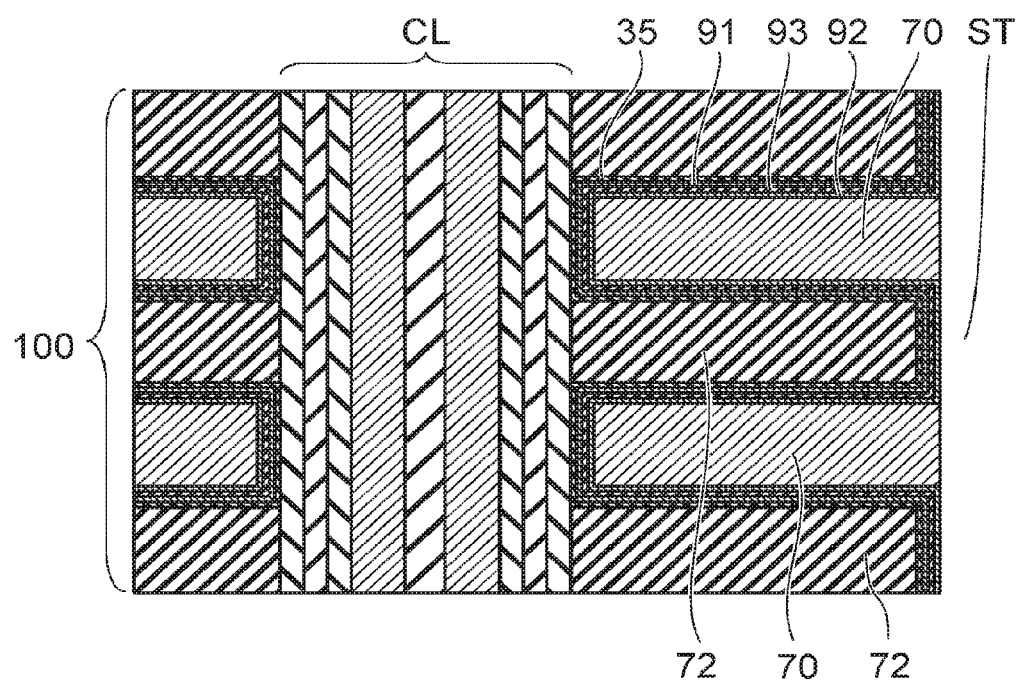

Further, as shown in FIG. 16, the metal layer 70 is formed also on the side surface of the slit ST. As shown in FIG. 17, the metal layer 70 that is formed on the side surface of the slit ST is removed by the etchant or the etching gas supplied to the slit ST. The electrical connection between the metal layers 70 adjacent to each other above and below is divided by the removal of the metal layer 70.

The metal layer 70 on the side surface of the slit ST is removed; and the second metal nitride film 92 that is formed along the side surface of the insulating layer 72 is exposed in the slit ST. The second metal nitride film 92 is removed by the etchant or the etching gas supplied to the slit ST.

The intermediate film 93 that is formed along the side surface of the insulating layer 72 is exposed in the slit ST by the removal of the second metal nitride film 92. The intermediate film 93 is removed by the etchant or the etching gas supplied to the slit ST.

The first metal nitride film 91 that is formed along the side surface of the insulating layer 72 is exposed in the slit ST by the removal of the intermediate film 93. The first metal nitride film 91 is removed by the etchant or the etching gas supplied to the slit ST.

Figure 18:
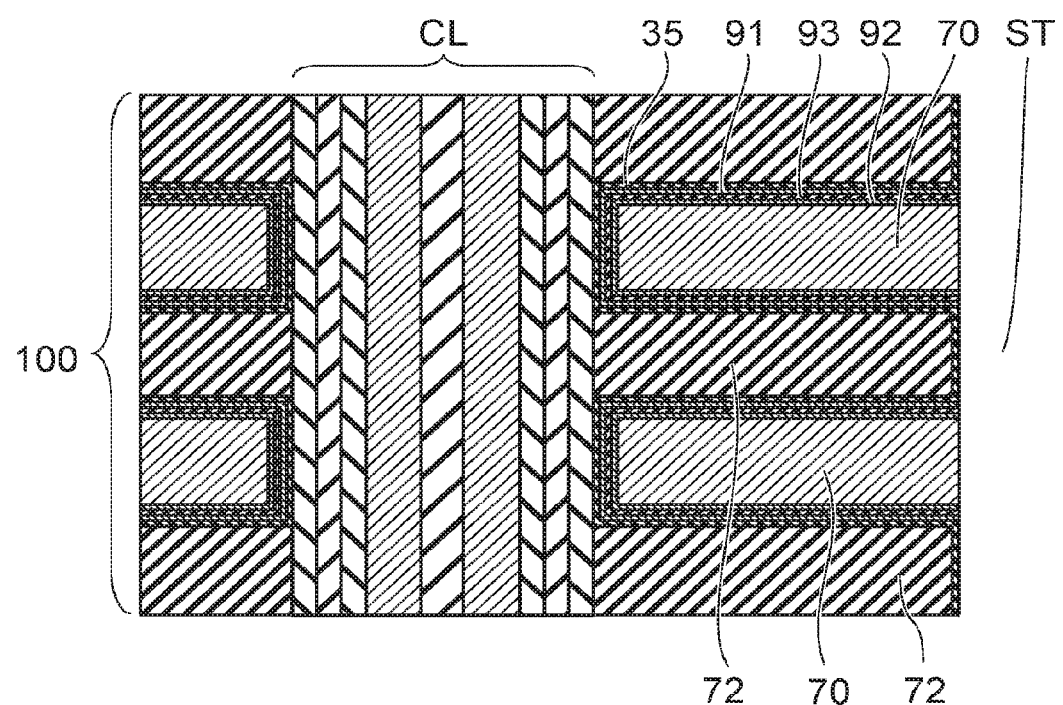

As shown in FIG. 18, the second blocking film 35 that is formed on the side surface of the insulating layer 72 is exposed in the slit ST by the removal of the first metal nitride film 91.

The electrical connection via the second metal nitride film 92 and the first metal nitride film 91 between the metal layers 70 adjacent to each other above and below is broken by the removal of the second metal nitride film 92 and the first metal nitride film 91 formed along the side surface of the slit ST.

Figure 21:
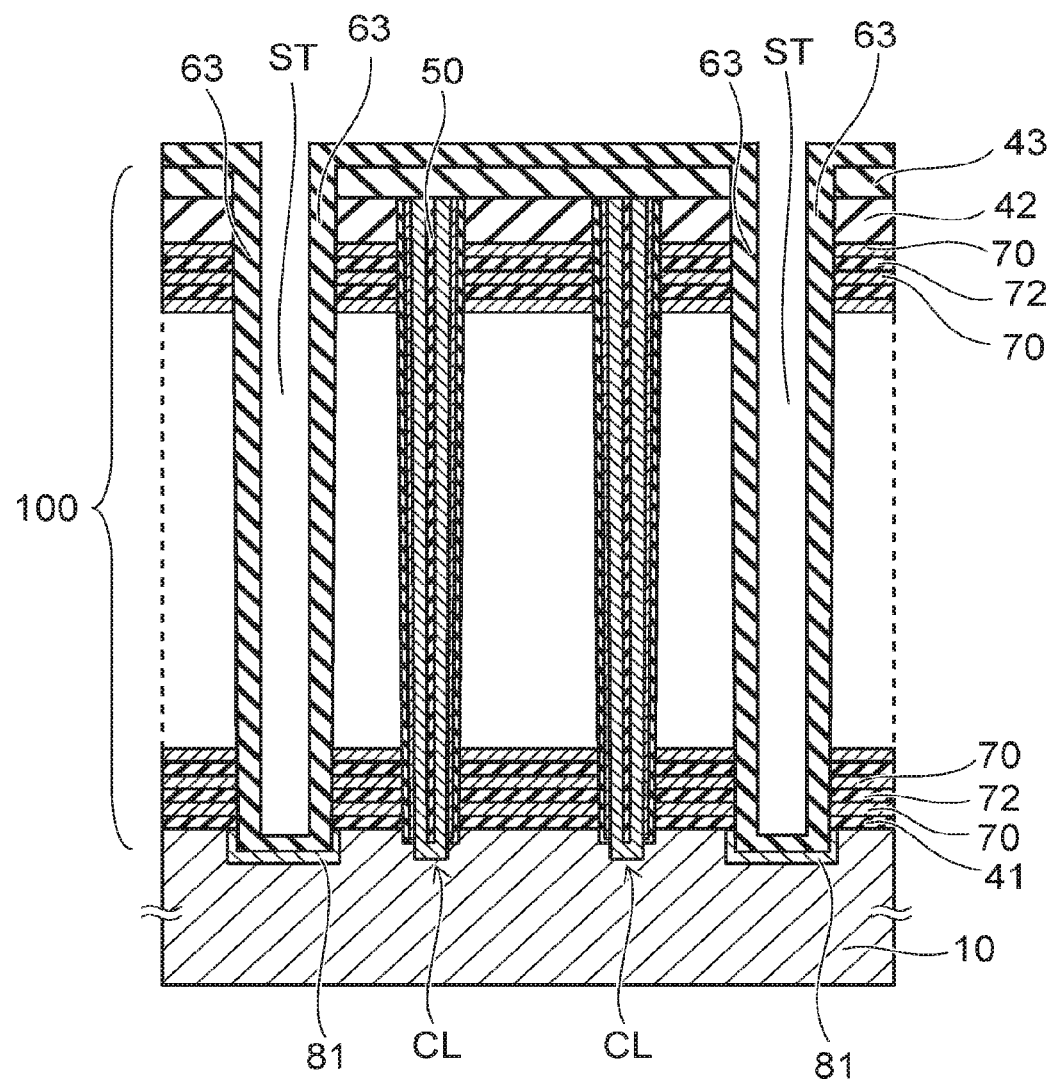

After the second metal nitride film 92 and the first metal nitride film 91 are divided, as shown in FIG. 21, the insulating film 63 is formed on the side surface and bottom of the slit ST.

After removing the insulating film 63 formed on the bottom of the slit ST by RIE, the interconnect portion LI is buried inside the insulating film 63 in the slit ST as shown in FIG. 2. The lower end of the interconnect portion LI is connected to the substrate 10 via the semiconductor region 81. Subsequently, the bit lines BL and the source line SL shown in FIG. 1 and the like are formed.

The first metal nitride film 91 and the second metal nitride film 92 may be metal nitride films other than titanium nitride films. For example, the first metal nitride film 91 and the second metal nitride film 92 include at least one of a titanium nitride film, a tantalum nitride film, a tungsten nitride film, or an aluminum nitride film. Effects similar to those of the case where the titanium nitride film recited above is used also can be expected for the first metal nitride film 91 and the second metal nitride film 92 including the tantalum nitride film, the tungsten nitride film, and the aluminum nitride film.

Figure 23:
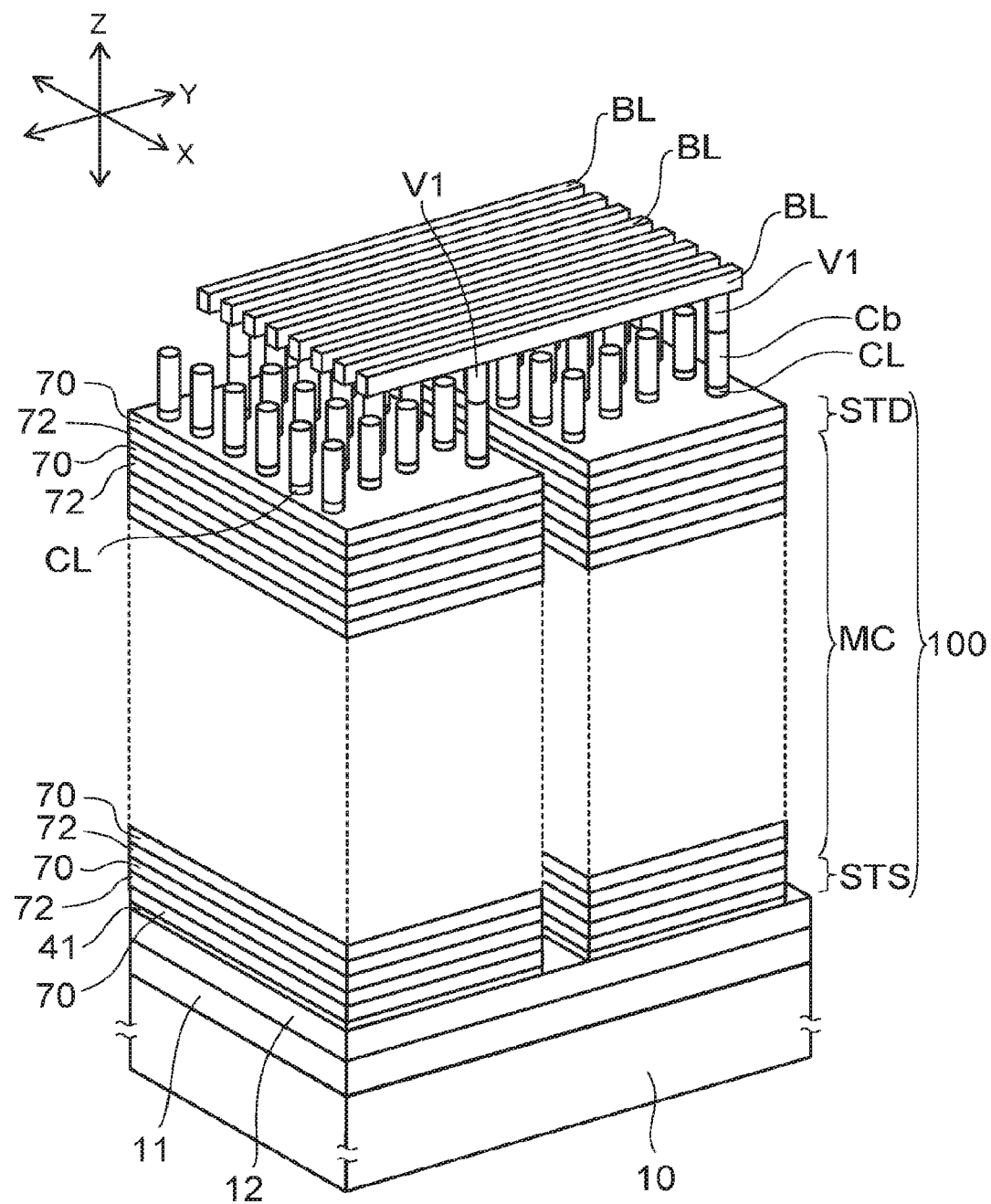
FIG. 23 is a schematic perspective view of another example of the memory cell array of the semiconductor device of the embodiment.

As shown in FIG. 23, a layer 11 and a layer 12 may be provided between the substrate 10 and the stacked body 100.

The layer 11 is provided between the substrate 10 and the layer 12; and the layer 12 is provided between the layer 11 and the stacked body 100.

The layer 12 is a semiconductor layer or a conductive layer. Or, the layer 12 may include a stacked film of a semiconductor layer and a conductive layer.

The layer 11 includes a control circuit including transistors and interconnects.

The lower end of the semiconductor body 20 contacts the layer 12; and the layer 12 is connected to the control circuit. Accordingly, the lower end of the semiconductor body 20 is electrically connected to the control circuit via the layer 12. The layer 12 also can be used as a source line of the lower layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a substrate;
a stacked body stacked on the substrate, the stacked body including a plurality of metal layers, a plurality of insulating layers, a plurality of metal oxide films, a plurality of first metal nitride films, a plurality of second metal nitride films, and a plurality of intermediate films, the metal oxide films being provided between the metal layers and the insulating layers, the first metal nitride films being provided between the metal oxide films and the metal layers, the second metal nitride films being provided between the first metal nitride films and the metal layers, the intermediate films being provided between the first metal nitride films and the second metal nitride films, the intermediate films being of a different type of material from the metal oxide films;
a semiconductor body extending in a stacking direction of the stacked body through the stacked body; and
a stacked film provided between the semiconductor body and the metal layers, the stacked film including a charge storage film.

2. The semiconductor device according to claim 1, wherein the metal oxide films are aluminum oxide films, and the first metal nitride films are titanium nitride films.

3. The semiconductor device according to claim 1, wherein the intermediate films are silicon oxide films, and the second metal nitride films are titanium nitride films.

4. The semiconductor device according to claim 1, wherein the first metal nitride films are titanium nitride films, and the intermediate films are titanium oxide films.

5. The semiconductor device according to claim 1, wherein the metal layers are tungsten layers or molybdenum layers.

6. The semiconductor device according to claim 5, wherein the metal layers contain fluorine.

7. The semiconductor device according to claim 1, wherein the metal oxide films are provided also between the stacked film and side surfaces of the metal layers.

8. The semiconductor device according to claim 1, wherein
the first metal nitride films include a titanium nitride film having a crystal orientation distribution having a peak at (220), and
the second metal nitride films include a titanium nitride film having a crystal orientation distribution having peaks at (111), (200), and (220).

9. The semiconductor device according to claim 1, further comprising:
an interconnect portion dividing the stacked body in a first direction, the first direction being parallel to a major surface of the substrate; and
an insulating film provided between the interconnect portion and the metal layers,
a lower end of the interconnect portion and a lower end of the semiconductor body contacting the substrate.

10. The semiconductor device according to claim 1, wherein the first metal nitride films and the second metal nitride films include at least one of a titanium nitride film, a tantalum nitride film, a tungsten nitride film, or an aluminum nitride film.

11. A method for manufacturing a semiconductor device, comprising:
forming a stacked body on a substrate, the stacked body including a plurality of first layers and a plurality of second layers, the first layers and the second layers including a first layer and a second layer stacked alternately;
making a hole in the stacked body, the hole extending in a stacking direction of the stacked body;
forming a stacked film and a semiconductor body on a side surface of the hole, the stacked film including a charge storage film;
making a slit in the stacked body, the slit extending in the stacking direction;
making a gap between the second layers by etching to remove the first layers through the slit, the gap communicating with the slit;
forming a metal oxide film on an upper surface and a lower surface of the second layer exposed in the gap;

forming a first metal nitride film on an inner side of the metal oxide film inside the gap;

forming an intermediate film on an inner side of the first metal nitride film inside the gap, the intermediate film being of a different type of material from the metal oxide film;

forming a second metal nitride film on an inner side of the intermediate film inside the gap; and forming a metal layer on an inner side of the second metal nitride film inside the gap.

12. The method for manufacturing the semiconductor device according to claim 11, wherein the first metal nitride film is a titanium nitride film, and a silicon oxide film is formed as the intermediate film on the titanium nitride film.

13. The method for manufacturing the semiconductor device according to claim 12, wherein a titanium nitride film is formed as the second metal nitride film on the silicon oxide film.

14. The method for manufacturing the semiconductor device according to claim 11, wherein the first metal nitride film is a titanium nitride film, and a titanium oxide film is formed as the intermediate film by exposing the titanium nitride film to ambient air.

15. The method for manufacturing the semiconductor device according to claim 11, wherein the first layer is a silicon nitride layer and is removed using an etchant containing phosphoric acid.

16. The method for manufacturing the semiconductor device according to claim 11, wherein a tungsten layer is formed as the metal layer by CVD using a gas containing tungsten fluoride.

17. The method for manufacturing the semiconductor device according to claim 11, wherein a molybdenum layer is formed as the metal layer by CVD using a gas containing molybdenum fluoride.

18. The method for manufacturing the semiconductor device according to claim 11, further comprising:

forming an insulating film on a side surface of the slit after the forming of the metal layer; and forming an interconnect portion on an inner side of the insulating film inside the slit, the interconnect portion contacting the substrate.

19. The method for manufacturing the semiconductor device according to claim 11, wherein a side surface of the stacked film is exposed in the gap by the removing of the first layers, and the metal oxide film is formed also on the side surface of the stacked film.

20. The method for manufacturing the semiconductor device according to claim 19, wherein an aluminum oxide film is formed as the metal oxide film.

* * * * *